(12) United States Patent
Hu et al.

(10) Patent No.: US 11,199,600 B2
(45) Date of Patent: Dec. 14, 2021

(54) SUPERCONDUCTING MAGNET WITH COLD HEAD THERMAL PATH COOLED BY HEAT EXCHANGER

(71) Applicant: KONINKLIJKE PHILIPS N.V., Eindhoven (NL)

(72) Inventors: Hong Hu, Watervliet, NY (US); Joshua Kent Hildebrand, Mechanicville, NY (US); Glen George Pfleiderer, Voorheesville, NY (US)

(73) Assignee: Koninklijke Philips N.V., Eindhoven (NL)

( * ) Notice: Subject to any disclaimer, the term of this patent is extended or adjusted under 35 U.S.C. 154(b) by 51 days.

(21) Appl. No.: 16/630,500

(22) PCT Filed: Jul. 17, 2018

(86) PCT No.: PCT/EP2018/069343
§ 371 (c)(1),
(2) Date: Jan. 13, 2020

(87) PCT Pub. No.: WO2019/016180
PCT Pub. Date: Jan. 24, 2019

(65) Prior Publication Data
US 2020/0150203 A1 May 14, 2020

Related U.S. Application Data

(60) Provisional application No. 62/533,191, filed on Jul. 17, 2017.

(51) Int. Cl.
*G01R 33/3815* (2006.01)
*G01R 33/38* (2006.01)
(Continued)

(52) U.S. Cl.
CPC ..... *G01R 33/3815* (2013.01); *G01R 33/3804* (2013.01); *H01F 6/04* (2013.01); *H01F 6/06* (2013.01)

(58) Field of Classification Search
CPC ... G01R 33/3815; G01R 33/3804; H01F 6/04; H01F 6/06
See application file for complete search history.

(56) References Cited

U.S. PATENT DOCUMENTS 4,223,540 A * 9/1980 Longsworth .............. H01F 6/04
62/51.1
4,277,949 A 7/1981 Longsworth
(Continued)

FOREIGN PATENT DOCUMENTS

GB 2458147 A 9/2009
GB 2537888 A 11/2016

OTHER PUBLICATIONS

International Search Report and Written Opinion From PCT/EP2018/069343 dated Jul. 17, 2018.

*Primary Examiner* — G. M. A Hyder

(57) ABSTRACT

A superconducting magnet includes a liquid helium reservoir (14), superconducting magnet windings (12) disposed in the liquid helium reservoir, and a vacuum jacket (20) surrounding the liquid helium reservoir. A cold head (30) passes through the vacuum jacket. The cold head has a warm end (32) welded to an outer wall (22) of the vacuum jacket and a cold station (46) disposed in the liquid helium reservoir. A heat exchanger (60) is disposed inside the vacuum jacket and secured to or integral with the cold head. The heat exchanger includes a fluid passage (62) having an inlet (64) in fluid communication with the liquid helium reservoir and having an outlet (66) in fluid communication with ambient air. While the cold head is turned off, gas helium flows from
(Continued)

the liquid helium reservoir to ambient air via the heat exchanger, thereby cooling the non-operating cold head.

20 Claims, 4 Drawing Sheets

(51) Int. Cl.
*H01F 6/04* (2006.01)
*H01F 6/06* (2006.01)

(56) References Cited

U.S. PATENT DOCUMENTS

| | | |
|---|---|---|
| 5,586,437 A | 12/1996 | Blecher et al. |
| 2004/0221586 A1 | 11/2004 | Daniels |
| 2007/0214802 A1 | 9/2007 | Nemoto et al. |
| 2011/0179808 A1 | 7/2011 | Kagan et al. |
| 2011/0179809 A1 | 7/2011 | Zhang et al. |
| 2013/0008187 A1 | 1/2013 | Kraus et al. |
| 2015/0276129 A1 | 10/2015 | Retz et al. |
| 2016/0369946 A1 | 12/2016 | Tago et al. |

\* cited by examiner

SUPERCONDUCTING MAGNET WITH COLD HEAD THERMAL PATH COOLED BY HEAT EXCHANGER

CROSS REFERENCE TO RELATED APPLICATIONS

This application is a U.S. national phase application of International Application No. PCT/EP2018/069343 filed on Jul. 17, 2017, which claims the benefit of U.S. Provisional Application Ser. No. 62/533,191 filed Jul. 17, 2017 and is incorporated herein by reference.

FIELD

The following relates generally to the superconducting magnet arts, magnetic resonance imaging (MRI) arts, thermal management arts, and related arts.

BACKGROUND

In a typical superconducting magnet for a magnetic resonance imaging (MRI) system, the superconducting windings are immersed in liquid helium (LHe) contained in a LHe reservoir surrounded by a vacuum jacket. A high conductivity thermal shield of sheet material is disposed in the vacuum jacket to surround the LHe reservoir. After manufacture, the vacuum is drawn and the LHe reservoir is filled with LHe. To maintain the LHe at cryogenic temperature (i.e. below 4K), a cold head is used to provide refrigeration to the LHe vessel. The first stage of the cold head penetrates through into the vacuum volume, and the first stage cold station is connected to the thermal shield by a high thermal conductance link that connects with a thermal bus attached to the thermal shield. The second stage of the cold head continues into the LHe volume to be disposed in the gaseous He overpressure above the LHe level in the LHe reservoir. During shipment, the cold head is turned off and the magnet is shipped with the LHe charge loaded. With the cold head off, the vacuum jacket is relied upon to provide sufficient thermal insulation to maintain the LHe charge in its liquid state during shipping.

The following discloses a new and improved systems and methods.

SUMMARY

In one disclosed aspect, a superconducting magnet includes a liquid helium reservoir, superconducting magnet windings disposed in the liquid helium reservoir, and a vacuum jacket surrounding the liquid helium reservoir. A cold head passes through the vacuum jacket. The cold head has a warm end welded to an outer wall of the vacuum jacket and a cold station disposed in the liquid helium reservoir. A heat exchanger is disposed inside the vacuum jacket and secured to or integral with the cold head. The heat exchanger includes a fluid passage having an inlet in fluid communication with the liquid helium reservoir and having an outlet in fluid communication with ambient air.

In a disclosed method aspect utilizing the foregoing superconducting magnet, while the cold head is turned off, gas helium flows from the liquid helium reservoir to ambient air via the heat exchanger, thereby cooling the non-operating cold head. Thus, for example, during transport of the superconducting magnet while the cold head is turned off, the flowing of gas helium from the liquid helium reservoir to ambient air via the heat exchanger reduces helium boil-off during the transport.

In another disclosed aspect, a cold head comprises: a first stage section having a warm end and an opposite end defining a first stage cold station; a second stage section having a proximate end connected with the first stage cold station and a distal end defining a second stage cold station; and a heat exchanger secured to or integral with at least the first stage section. The heat exchanger includes a fluid passage having an inlet and an outlet.

One advantage resides in providing a superconducting magnet with reduced liquid helium (LHe) boil-off.

Another advantage resides in providing a superconducting magnet with reduced likelihood of quench during extended intervals over which the cold head is shut off.

Another advantage resides in providing a superconducting magnet that can be shipped over longer distances with a LHe charge.

Another advantage resides in providing a superconducting magnet that can have its cold head shut off for more extended time intervals to facilitate longer-distance shipping, extended maintenance, or so forth.

Another advantage resides in providing a superconducting magnet with reduced liquid helium evaporation during intervals over which the cold head is turned off or is non-operational.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Figure 1:
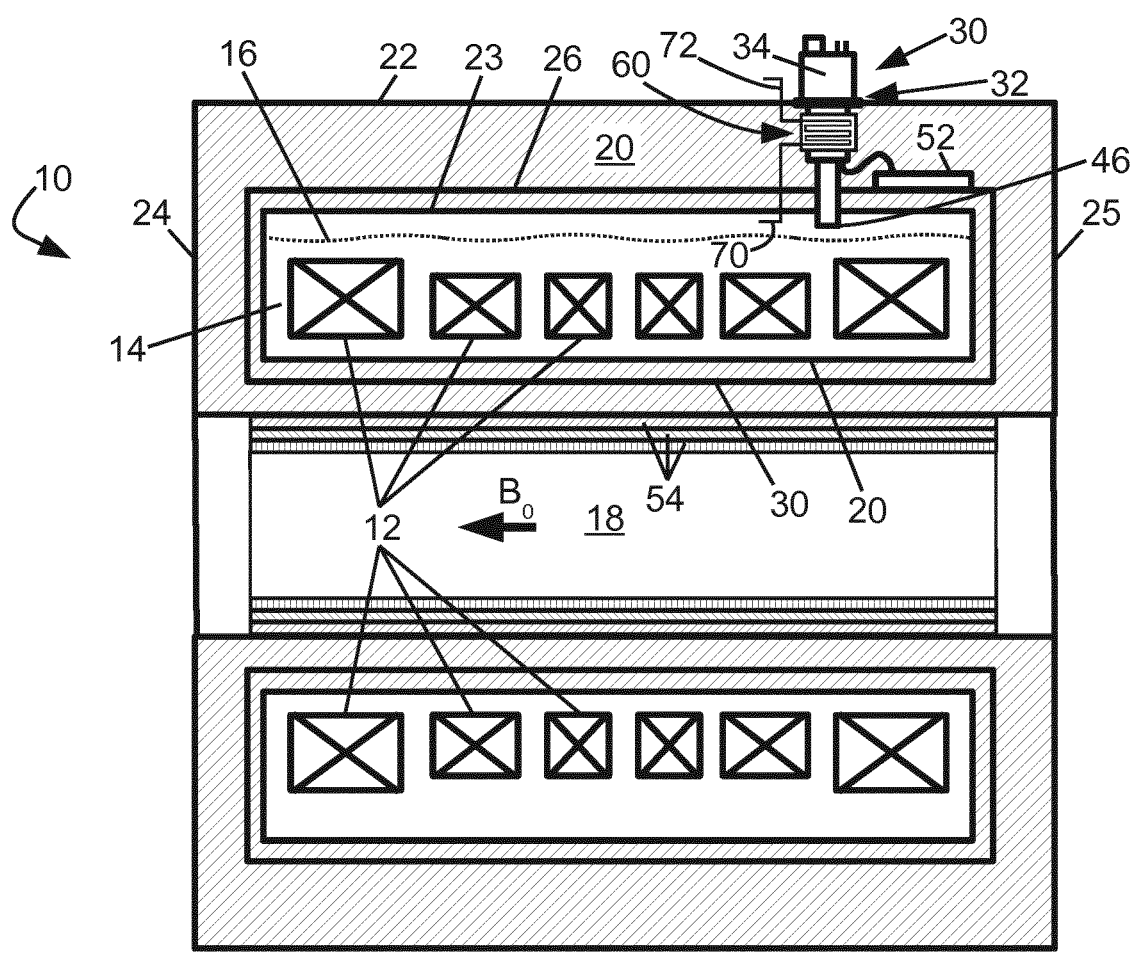
FIG. 1 diagrammatically illustrates a side sectional view of a magnetic resonance imaging (MRI) system including a cold head with a heat exchanger secured to or integral with the first stage of the cold head.

As previously noted, after filling the LHe reservoir, the cold head is turned off and the MR magnet is shipped, with the LHe charge loaded and the vacuum drawn, to the destination. If shipped by air, the cold head remains off during the entire shipping time interval. If transported by ship, the MR magnet may be refrigerated; however, even in this case there are extended time intervals during loading and offloading and trucking to and from the shipyard during which the cold head is shut off. When not actively refrigerated, the LHe slowly boils off, e.g. via a provided vent path such as a helium vent bellow.

The cold head typically comprises a stainless steel cylinder containing a motor-operated displacer executing a refrigeration cycle, e.g. using gas helium as a working cryogenic fluid, and an internal copper screen. The cold head installed on the magnet passes through the vacuum jacket, and has a warm end welded to an outer wall of the vacuum jacket and a cold station disposed in the liquid helium reservoir. In a commonly employed two-stage cold head, there is an intermediate cold station located at an intermediate position between the warm end and the cold station disposed in the liquid helium reservoir, e.g. inside the vacuum jacket. In this configuration, the intermediate cold station is commonly referred to as the first stage cold station, while the cold station disposed in the liquid helium reservoir is referred to as the second stage cold station. The first stage cold head is at a higher temperature than the second stage cold station (though still well below ambient temperature). During cold head operation, the refrigeration cycle operates to chill the stainless steel cylinder to cryogenic temperature, e.g. ≠4K-10K in some commercially available cold heads, with the distal end in the liquid helium reservoir being chilled to the coldest temperature (thus forming the second stage cold station).

However, when the cold head stops operating, the stainless steel cylinder, and particularly the first and second stage cold stations, warms up. This creates a thermal leakage path that can conduct heat from the warm end welded to the outer wall of the vacuum jacket to the second stage cold station in the liquid helium reservoir, thereby heating the LHe. This results in more rapid boiloff of LHe. The thermal leakage path formed by the stopped cold head can therefore limit shipping distance or otherwise constrain shipping options.

Similar problems can arise any time the cold head of the superconducting magnet is shut off for an extended time period, e.g. during maintenance, an extended power outage, during relocation of the MRI system, or so forth. As the superconducting coils carry superconducting current continuously, LHe loss has the potential to lead to a transition out of the superconducting state, referred to as a "quench" of the MR magnet.

In improvements disclosed herein, a heat exchanger is secured to the cold head (or, alternatively, may be formed integral with the cold head, e.g. integrated into the stainless steel cylinder). The heat exchanger has an inlet connected via a pipe or other fluid conduit to the gas helium overpressure in the LHe reservoir, and an outlet that discharges into the ambient. Thus, gas He (which, within the LHe reservoir, is at a low temperature close to the boiling point of LHe, i.e. ~4K) flows through the heat exchanger before venting to atmosphere, thereby cooling the cold head and reducing or eliminating the thermal leakage path presented by the cold head. This has the benefit of leveraging the sensible cooling capacity of the cold gas He to provide continued cooling of the cold head (and more particularly its stainless steel cylinder housing) over time intervals when the cold head is turned off.

With reference to FIG. 1, a side sectional view is shown of a magnetic resonance imaging (MRI) device 10, which employs a superconducting magnet. The magnet includes superconducting windings 12 disposed in a liquid helium (LHe) reservoir 14 which is mostly filled with LHe; however, there is a gaseous helium (gas He) overpressure present above the LHe level 16. The illustrative MRI device 10 employs a horizontal-bore magnet in which the superconducting magnet is generally cylindrical in shape and surrounds (i.e. defines) a horizontal bore 18; however, other magnet geometries are also contemplated. To provide thermal isolation of the LHe reservoir 14, a vacuum jacket 20 surrounds the LHe reservoir 14. The vacuum jacket 20 includes an outer wall 22 and an inner wall 23. The illustrative inner wall 23 is shared between the LHe reservoir 14 and the vacuum jacket 20 (i.e. forms the boundary between the LHe reservoir 14 and vacuum jacket 20). In an alternative embodiment, the LHe reservoir and vacuum jacket can have separate walls at this boundary that are welded together or otherwise coincident). The vacuum jacket 20 further includes side walls 24, 25 or the like sufficient to provide vacuum-tight sealing of its ends. The vacuum volume contained by the vacuum jacket 20 is diagrammatically indicated in FIG. 1 by hatching. A thermal shield 26 made of a sturdy thermally conductive material such as aluminum alloy sheet metal (or copper alloy sheet metal or some other high thermal conductivity sheet metal) is preferably disposed in the vacuum volume (that is, inside the vacuum jacket 20) and surrounds the LHe reservoir 14. The thermal shield 26 is spaced apart from the inner vacuum jacket wall 23 to avoid thermal conduction from the thermal shield 26 into the LHe reservoir 14. In some embodiments, the thermal shield 26 may comprise two or more thermal shield layers (variant not shown) spaced apart from each other and with the innermost shield layer spaced apart from the inner vacuum jacket wall 23.

Figure 2:
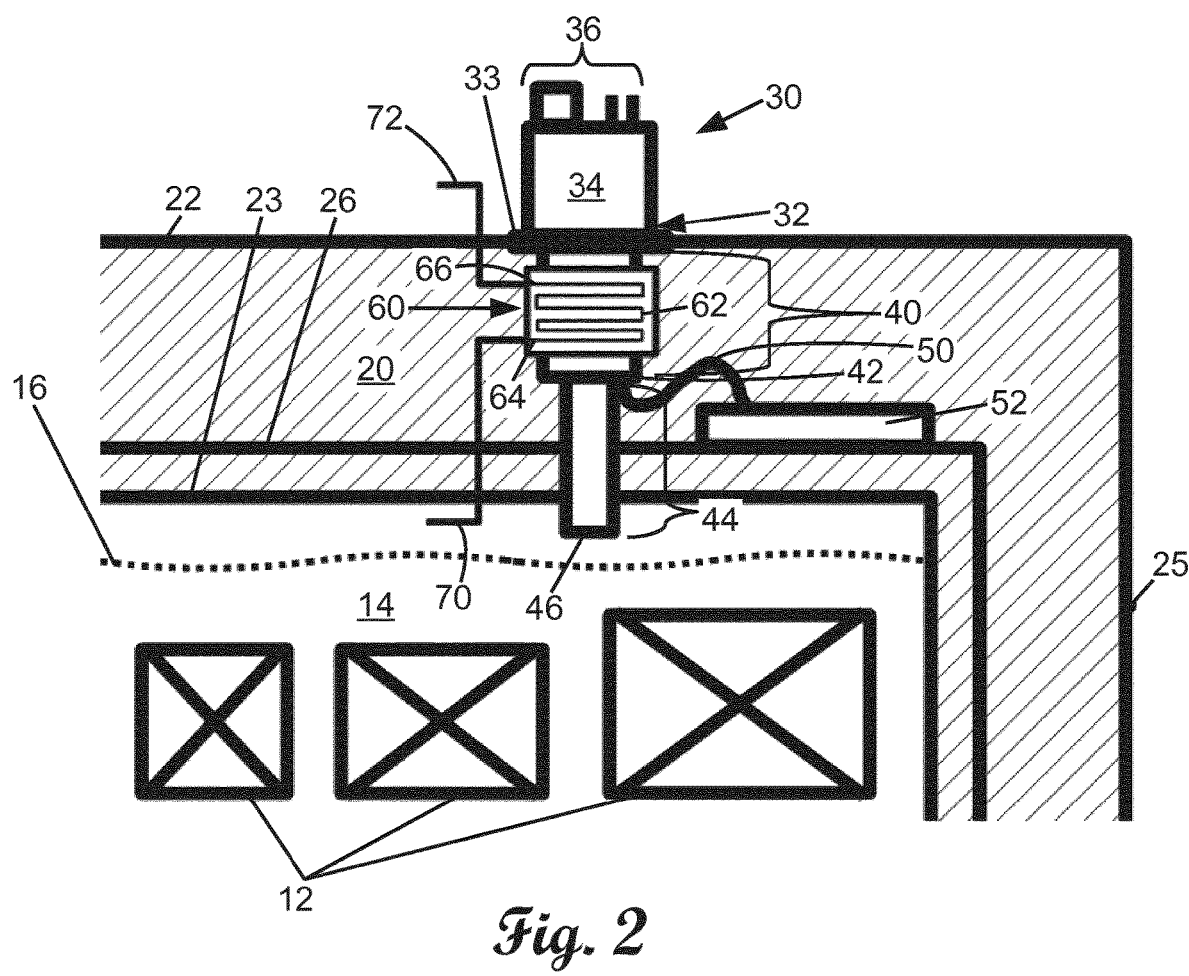
FIG. 2 diagrammatically illustrates an enlarged view of the portion of the side sectional view of FIG. 1 depicting the cold head and heat exchanger.

With continuing reference to FIG. 1 and with further reference to FIG. 2, a cold head 30 executes a refrigeration cycle using a working fluid such as helium to provide active cooling of the LHe reservoir 14 and, in the illustrative embodiment, also provides active cooling of the thermal shield 26. The cold head 30 passes through the vacuum jacket 20. A warm end 32 of the cold head 30 is welded to the outer wall 22 of the vacuum jacket by one or more welds 33. (Note, some features of the cold head 30 are labeled with reference numbers only in the enlargement shown in FIG. 2). A motorized drive assembly 34 is connected to the warm end 32 of the cold head 30 (and may be viewed as part of the warm end), and includes a motor that drives a displacer (internal components not shown) to cause cyclic compression and expansion of the working fluid in accord with a refrigeration cycle. At least a distal end of the motorized drive assembly 34 is outside of the vacuum jacket 20 and hence exposed to ambient air, and this exposed end includes connectors 36 for attachment of one or more electrical power cables and one or more hoses for injecting the working fluid (cables and hoses not shown). The illustrative cold head 30 is preferably a cylindrical cold head, although other geometries are contemplated.

The illustrative cold head 30 is a two-stage design that includes: a first stage section 40 having one end being the warm end 32 and an opposite end defining an intermediate (or first stage) cold station 42; and a second stage section 44 connected with the intermediate (or first stage) cold station 42 and penetrating into the liquid helium reservoir 14 to define a second stage cold station 46 disposed in the liquid helium reservoir 14. The first stage section 40 and the second stage section 44 each comprise a stainless steel cylinder housing through which the displacer passes, with the second stage section 44 typically having a smaller diameter than the first stage section 40. (That is, the first stage section 40 is cylindrical with a first diameter and the second stage section 44 is cylindrical with a second diameter smaller than the first diameter). The penetration of the second stage section 44 through the inner wall 23 is suitably sealed using an annular weld or other vacuum-tight seal.

The first stage cold station 42 is connected with the thermal shield 26 by a high conductance thermal link 50 that connects with a thermal bus 52 that is welded, brazed, or otherwise secured to the thermal shield 26. The second stage cold station 46 is disposed in gaseous He overpressure above the LHe level 16 in the LHe reservoir 14. The cold head 30 is designed and operated to cool the second stage cold station 46 to below the liquefaction temperature of helium, and the first stage cold station 42 to a higher temperature (albeit cool enough for the thermal shield 26 to provide effective thermal shielding of the LHe reservoir 14). To provide vacuum-tight seals, the cold head 30 is typically welded to the outer vacuum wall 22 and to the inner vacuum wall 23.

To operate the superconducting magnet, a LHe charge is loaded into the LHe reservoir 14 via a suitable fill line (not shown). The fill line or another ingress path also provides for inserting electrical conductive leads or the like (not shown) for connecting with and electrically energizing the magnet windings 12. A static electric current flowing through these windings 12 generates a static $B_0$ magnetic field, which is horizontal as indicated in FIG. 1 in the illustrative case of a horizontal bore magnet. After ramping the electric current in the magnet windings 12 up to a level chosen to provide the desired $|B_0|$ magnetic field strength, the contacts can be withdrawn and the zero electrical resistance of the superconducting magnet windings 12 thereafter ensures the electric current continues to flow in a persistent manner. From this point forward, the LHe charge in the LHe reservoir 14 should be maintained; otherwise, the superconducting windings 12 may warm to a temperature above the superconducting critical temperature for the magnet windings 12, resulting in a quench of the magnet. (To provide controlled shut-down in the event the LHe charge must be removed, the leads are preferably re-inserted and the magnet current ramped down to zero prior to removal of the LHe charge).

The MRI device optionally includes various other components known in the art, such as a set of magnetic field gradient coils 54 for superimposing selected magnetic field gradients onto the $B_0$ magnetic field in the x-, y-, and/or z-directions, a whole-body radio frequency (RF) coil (not shown) for exciting and/or detecting magnetic resonance signals, a patient couch (not shown) for loading a medical patient or other imaging subject into the bore 18 of the MRI device 10 for imaging, and/or so forth.

The cold head 30 beneficially chills the LHe reservoir 14 when the cold head is operational. However, the cold head is occasionally turned off. This may be done intentionally to prepare for maintenance, shipping of the magnet, or so forth, or may occur unintentionally due to some malfunction. Any time the cold head is turned off for any extended period of time, it will begin to warm up and create a thermal leakage path by which heat from ambient air contacting the warm end 32 and the motorized drive unit 34 can conduct into the LHe reservoir 14. Thus, the cold head 30 when turned off becomes a thermal liability.

With particular reference now to FIG. 2, the thermal leakage path presented by the non-operational cold head 30 is alleviated by providing a heat exchanger 60, which is disposed inside the vacuum jacket 20 and is secured to or integral with the cold head 30. The heat exchanger 60 includes a fluid passage 62 having an inlet 64 in fluid communication with the LHe reservoir 14, and having an outlet 66 in fluid communication with ambient air. To this end, in the illustrative embodiment an inlet fluid conduit 70 passes through the common wall 23 shared between the vacuum jacket 20 and the LHe reservoir 14. The inlet fluid conduit 70 provides fluid communication between the inlet 64 of the fluid passage 62 of the heat exchanger 60 and the LHe reservoir 14. Similarly, an outlet fluid conduit 72 passes through the outer wall 22 of the vacuum jacket 20 and provides fluid communication between the outlet 66 of the fluid passage 62 of the heat exchanger 60 and ambient air. In operation, gas helium from the LHe reservoir 14 is injected by the gas helium overpressure into the inlet fluid conduit 70 and flows through the fluid passage 62 and thence into the outlet fluid conduit 72 to be discharged into ambient air. As the gas helium flows through the fluid passage 62, it absorbs heat from the cold head 30.

To facilitate this heat transfer, the fluid passage 62 of the heat exchanger 60 is preferably serpentine or spirals around the cylindrical cold head 30 to provide a large contact area. Additionally or alternatively, the fluid passage 62 may be a multi-channel fluid passage, i.e. the fluid passage 62 may provide multiple paths for gas helium to flow from the inlet 64 to the outlet 66. The heat exchanger 60 can employ any conventional heat exchanger design for enhancing this heat transfer. In one illustrative embodiment, the heat exchanger comprises a metal shell wrapped around the cold head 30, and the fluid passage 62 is drilled, milled, or otherwise formed into this metal shell. In this approach, the metal shell provides a thermally conductive path from the fluid passage 62 to the cylindrical cold head 30. For maximum thermal contact, the heat exchanger 60 preferably wraps around the entire circumference of the (illustrative cylindrical) cold head 30. For manufacturing convenience, the metal shell may be divided into discrete segments, e.g. six arcuate segments each extending over a 60° arc, with tube connections between inlets and outlets of neighboring segments. Instead of a metal shell, the heat exchanger 60 may employ a shell or segments of another thermally conductive material that is more flexible, such as silicon type or acrylic type thermal conductive sheeting, with the fluid passage 62 being a tube embedded into the sheeting. These are merely illustrative examples of suitable heat exchanger designs.

In another embodiment, the heat exchanger 60 is integral with the cold head 30. For example, the cold head 30 may employ a housing made of stainless steel cylinders, e.g. a larger diameter cylinder forming the housing of the first stage section 40, and a smaller diameter cylinder forming the housing of the second stage section 44. In this integral design, the cylindrical stainless steel housing 40, 44 of the cold head 30 suitably has embedded tubing forming the fluid passage 62 of the heat exchanger, and the cylindrical stainless steel housing 40, 44 of the cold head 30 also forms the body of the heat exchanger 60.

As another contemplated embodiment, the heat exchanger 60 may comprise stainless steel tubing that is wrapped around the cold head 30 and is welded, brazed, or otherwise secured to outer surfaces of the cylindrical stainless steel housing 40, 44 of the cold head 30. This approach is straightforward to manufacture or even retrofit to an existing cold head, but has less thermal transfer surface area compared with other illustrative designs.

In the embodiment of FIGS. 1 and 2, the heat exchanger 60 is secured to the first stage section 40 of the cold head 30, but is not secured to the second stage section 44 of the cold head 30. Since heat flows from the ambient air into the warm end 32 of the cold head 30, providing cooling via the heat exchanger 60 of the first stage section 40 only (without also cooling the second stage section 44) provides substantial benefit.

Figure 3:
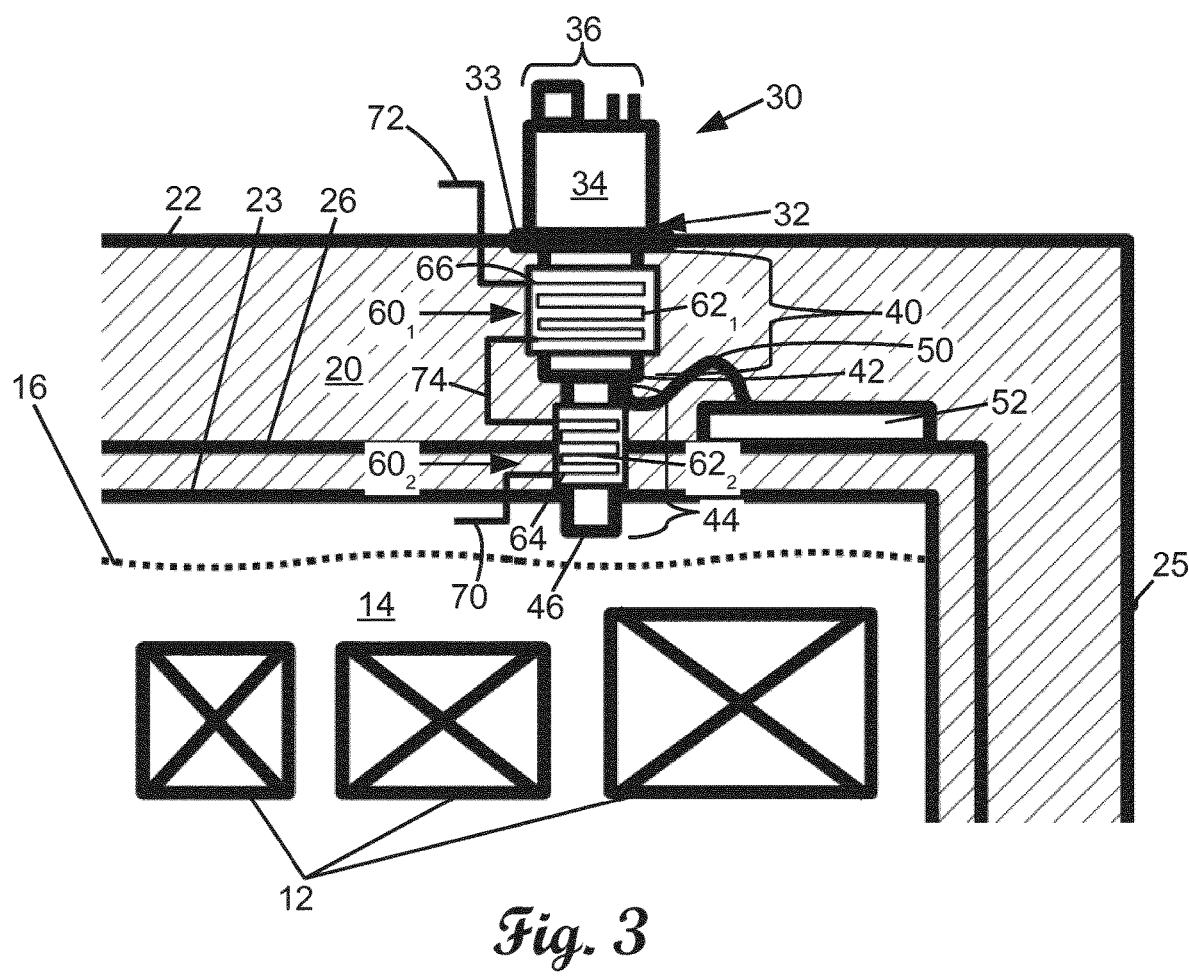
FIG. 3 diagrammatically illustrates the enlarged view of FIG. 2 with a variant embodiment in which the heat exchanger is secured to or integral with both the first stage and the second stage of the cold head.

However, with reference now to FIG. 3, a variant embodiment also provides cooling via the heat exchanger of the second stage section 44. The embodiment of FIG. 3 includes the same superconducting magnet as in FIG. 1 and the same cold head 30 as in FIGS. 1 and 2. The embodiment of FIG. 3 differs from that of FIG. 2 in that, in the embodiment of FIG. 3, the heat exchanger $60_1$, $60_2$ includes a first heat exchanger section $60_1$ (with a first fluid passage $62_1$) secured to or integral with the first stage section 40 of the cold head 30, and also an added second heat exchanger section $60_2$ (with a second fluid passage $62_2$) which is secured to or integral with the second stage section 44 of the cold head 30. The second heat exchanger section $60_2$ includes the inlet 64 of the heat exchanger $60_1$, $60_2$ in fluid communication with the LHe reservoir via the inlet fluid conduit 70. The first heat exchanger section $60_1$ includes the outlet 66 of the heat exchanger in fluid communication with ambient air via the outlet fluid conduit 72. The heat exchanger $60_1$, $60_2$ further includes a fluid conduit 74 connecting the first heat exchanger section $60_1$ and the second heat exchanger section $60_2$ in series. That is, the gas helium flows into the inlet 64, through the second heat exchanger section $60_2$, then through the fluid conduit 74 and into the first heat exchanger section $60_1$, and finally exits from the outlet 66 of the first heat exchanger section $60_1$ and discharged into ambient air.

The disclosed heat exchanger 60 has the dual benefits of providing a gas helium overpressure vent path and leveraging the sensible cooling capacity of the cold gas He in the LHe tank 14 to provide cooling of the cold head 30 over time intervals when the cold head 30 is turned off (or, more generally, not operating to provide cryogenic cooling).

The heat exchanger 60 should be helium leak-tight because any gas helium leaking out of the heat exchanger 60 will enter the vacuum contained by the vacuum jacket 20. Excessive gas leakage into this vacuum space can compromise the thermal insulation of the LHe reservoir 14, which in an extreme case can lead to rapid boiling of the liquid helium and potential magnet quench or damage.

Figure 4:
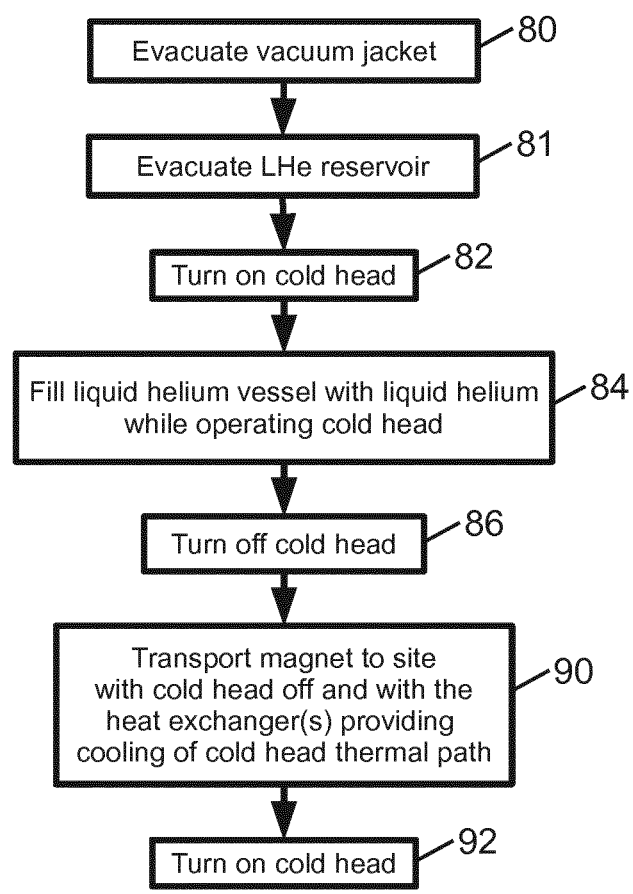
FIG. 4 diagrammatically illustrates a process for charging the superconducting magnet of FIG. 1 with liquid helium (LHe) and transporting it from the factory to a destination.

With reference to FIG. 4, a process for loading a LHe charge and transporting the superconducting magnet of the MRI device 10 of FIG. 1 is described. Starting with the fabricated magnet, in an operation 80 the vacuum jacket 20 is evacuated using suitable vacuum couplings (not shown in FIG. 1) on the outer vacuum wall 22. In an operation 81, the liquid helium reservoir 14 is evacuated. In an operation 82, the cold head 30 is turned on and in an operation 84 the liquid helium (LHe) charge is loaded via a fill line (not shown in FIG. 1) passing through the outer vacuum wall 22. It will be appreciated that the operations 82, 84 may be performed in a different order, and/or additional operations known in the art may be performed. Typically, the operation 84 entails evacuating air from the LHe reservoir 14 prior to flowing the LHe into the LHe reservoir 14. After charging the superconducting magnet with LHe, in an operation 86 the cold head 30 is turned off preparatory to transport operation(s) 90 in which the superconducting magnet (filled with the LHe charge) is transported. During the operation(s) 90 the heat exchanger 60 operates to provide cooling of the cold head 30, as well as to provide a vent path for overpressure of gas helium in the LHe reservoir 14. Because the gas helium in the LHe reservoir 14 is an overpressure above the LHe level 16, the gas helium is at a temperature above, but relatively close to, the boiling temperature of the LHe, i.e. around 4K at (close to) atmospheric pressure. Thus, even without operation of the cold head 30, the heat exchanger 60 operates to provide a passive mechanism for cooling the non-operating cold head 30, which in turn reduces the rate of evaporation of the LHe in the LHe reservoir 14. This reduction in LHe evaporation rate allows for longer transport times and consequently longer achievable transport distances. After arriving at the destination, in an operation 92 the cold head 30 is turned back on, thereafter providing active cooling of the LHe reservoir 14.

While advantages of the disclosed heat exchanger 60 thermally coupled with the cold head 30 accrue during magnet transport as described with reference to FIG. 4, it will be appreciated that analogous benefit is obtained for any procedure or situation in which the cold head 30 is turned off or otherwise non-operational for an extended time period, e.g. while the cold head 30 is turned off during maintenance, or during extended electrical power outages, or during a malfunction of the cold head 30 that compromises or prevents active cooling via the cold head 30, or so forth. In such situations, the reduced LHe evaporation reduces the likelihood that the LHe charge will be unduly depleted, and reduces the likelihood that LHe depletion may lead to magnet quenching.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A superconducting magnet comprising:
   a liquid helium reservoir;
   superconducting magnet windings disposed in the liquid helium reservoir;
   a vacuum jacket surrounding the liquid helium reservoir;
   a cold head passing through the vacuum jacket, the cold head having a warm end welded to an outer wall of the vacuum jacket and a cold station disposed in the liquid helium reservoir; and
   heat exchanger disposed inside the vacuum jacket and secured to or integral with the cold head, the heat exchanger including a fluid passage having an inlet in fluid communication with the liquid helium reservoir and having an outlet in fluid communication with ambient air.

2. The superconducting magnet of claim 1 wherein the cold head further includes a motorized drive assembly disposed outside of the vacuum jacket and connected with the warm end of the cold head, the drive assembly including one or more connectors exposed to ambient air.

3. The superconducting magnet of claim 1 wherein the cold head is a cylindrical cold head.

4. The superconducting magnet of claim 1 wherein the heat exchanger includes:
   a first stage section having one end being the warm end of the cold head and an opposite end defining an intermediate cold station; and
   a second stage section connected with the intermediate cold station and penetrating into the liquid helium reservoir to define the cold station disposed in the liquid helium reservoir.

5. The superconducting magnet of claim 4 wherein the heat exchanger is secured to the first stage section and is not secured to the second stage section.

6. The superconducting magnet of claim 4 wherein the heat exchanger includes:
   a first heat exchanger section secured to or integral with the first stage section of the cold head; and a second heat exchanger section secured to or integral with the second stage section (44) of the cold head.

7. The superconducting magnet of claim 6 wherein:
the second heat exchanger section includes the inlet of the heat exchanger in fluid communication with the liquid helium reservoir;
the first heat exchanger section includes the outlet of the heat exchanger in fluid communication with ambient air; and
the heat exchanger further includes a fluid conduit connecting the first heat exchanger section and the second heat exchanger section in series.

8. The superconducting magnet of claim 4 further comprising:
a thermal shield disposed in the vacuum jacket and surrounding the liquid helium reservoir;
wherein the intermediate cold station is in thermal contact with the thermal shield.

9. The superconducting magnet of claim 1 wherein the heat exchanger further includes:
an inlet fluid conduit passing through a common wall shared between the vacuum jacket and the liquid helium reservoir, the inlet fluid conduit providing fluid communication between the inlet of the fluid passage of the heat exchanger and the liquid helium reservoir.

10. The superconducting magnet of claim 1 wherein the heat exchanger further includes:
an outlet fluid conduit passing through the outer wall of the vacuum jacket and providing fluid communication between the outlet of the fluid passage of the heat exchanger and ambient air.

11. The superconducting magnet of claim 1 wherein the fluid passage of the heat exchanger comprises one or more of a serpentine, spiral, or multi-channel fluid passage.

12. A magnetic resonance imaging (MRI) device comprising:
a superconducting magnet as set forth in claim 1 which is generally cylindrical in shape and defines a horizontal bore; and
a set of magnetic field gradient coils arranged to superimpose magnetic field gradients on a static magnetic field generated in the horizontal bore by the superconducting magnet.

13. A method performed in conjunction with a superconducting magnet comprising a liquid helium reservoir, superconducting magnet windings disposed in the liquid helium reservoir, a vacuum jacket surrounding the liquid helium reservoir, a cold head passing through the vacuum jacket from a warm end of the cold head welded to an outer wall of the vacuum jacket to a cold station disposed in the liquid helium reservoir, and a heat exchanger disposed inside the vacuum jacket and secured to or integral with the cold head, the heat exchanger having an inlet in fluid communication with the liquid helium reservoir and an outlet in fluid communication with ambient air, the method comprising:
turning off the cold head; and
while the cold head is turned off, flowing gas helium from the liquid helium reservoir to ambient air via the heat exchanger.

14. The method of claim 13 further comprising:
transporting the superconducting magnet while the cold head is turned off whereby the flowing of gas helium from the liquid helium reservoir to ambient air via the heat exchanger reduces helium boil-off during the transporting.

15. A cold head comprising:
a first stage section having a warm end and an opposite end defining a first stage cold station;
a second stage section having a proximate end connected with the first stage cold station and a distal end defining a second stage cold station, wherein the distal end of the second stage section is configured to penetrate into an associated liquid helium reservoir of a superconducting magnet; and
a heat exchanger secured to or integral with at least the first stage section, the heat exchanger including a fluid passage having an inlet in the first stage section in fluid communication with an associated liquid helium reservoir of a superconducting magnet and an outlet in the second stage section to ambient air.

16. The cold head of claim 15 further comprising:
a motorized drive assembly connected with the warm end of the first stage section, the drive assembly including one or more operational connectors exposed to ambient air.

17. The cold head of claim 15 wherein the first stage section is cylindrical with a first diameter and the second stage section is cylindrical with a second diameter smaller than the first diameter.

18. The cold head of claim 15 wherein the heat exchanger is secured to or integral with the first stage section and is not secured to or integral with the second stage section.

19. The cold head of claim 15 wherein the heat exchanger includes:
a first heat exchanger section secured to or integral with the first stage section of the cold head; and
a second heat exchanger section secured to or integral with the second stage section of the cold head.

20. The cold head of claim 19 wherein:
the second heat exchanger section includes the inlet of the heat exchanger;
the first heat exchanger section includes the outlet of the heat exchanger; and
the heat exchanger further includes a fluid conduit connecting the first heat exchanger section and the second heat exchanger section in series.

* * * * *